United States Patent
Chatterjee et al.

(10) Patent No.: US 7,859,289 B2
(45) Date of Patent: Dec. 28, 2010

(54) METHOD FOR MEASURING INTERFACE TRAPS IN THIN GATE OXIDE MOSFETS

(75) Inventors: Tathagata Chatterjee, Allen, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/831,122

(22) Filed: Jul. 6, 2010

(65) Prior Publication Data
US 2010/0274506 A1 Oct. 28, 2010

Related U.S. Application Data

(63) Continuation of application No. 11/584,056, filed on Oct. 20, 2006, now abandoned.

(51) Int. Cl.
*G01R 31/28* (2006.01)

(52) U.S. Cl. .......... 324/765; 702/117; 438/17
(58) Field of Classification Search .......... None
See application file for complete search history.

(56) References Cited

U.S. PATENT DOCUMENTS 5,521,525 A * 5/1996 Nicollian et al. .......... 324/765

\* cited by examiner

*Primary Examiner*—Paresh Patel
(74) *Attorney, Agent, or Firm*—Warren L. Franz; Wade J. Brady, III; Frederick J. Telecky, Jr.

(57) ABSTRACT

A method for measuring interface traps in a MOSFET, includes measuring charge pumping current of a pulse wave form for various frequencies over a predetermined frequency range, creating plotted points of the measured charge pumping current versus the predetermined frequency range, determining the total number of interface traps participating in the charge pumping current by calculating the slope of a best fit line through the plotted points.

14 Claims, 4 Drawing Sheets

METHOD FOR MEASURING INTERFACE TRAPS IN THIN GATE OXIDE MOSFETS

This is a continuation of application Ser. No. 11/584,056 filed Oct. 20, 2006, the entirety of which is incorporated herein by reference.

BACKGROUND

This relates to interface traps within metal oxide semiconductor field effect transistors (MOSFETs); and, in particular, to methods for measuring interface traps in thin gate oxide MOSFETs.

As is known in the art, semiconductor wafers often contain material interfaces, such as between silicon and silicon dioxide (i.e., a Si—SiO$_2$ interface). Contaminants and other defects at the oxide/silicon interface can cause problems in the manufacture and performance of integrated circuits that are fabricated over that interface. These defects, often referred to as interface traps, are capable of trapping and de-trapping charge carriers. Interface traps can have an adverse effect on device performance. For example, an interface trap can cause discrete switching in the source conductance, band-to-band tunneling (BBT) of hot carriers from the gate-to-drain which can result in gate-induced drain leakage current, drain current fluctuation, voltage drop in the gate area, threshold voltage shift in the MOS transistors, and the like.

Impurities (such as contaminants, metals, and the like) may, for example, be introduced at the oxide layer/semiconductor interface of MOS transistors during oxidation processing, plasma deposition, etching or other processing steps. There is therefore a need to determine the quality of these interfaces prior to or during the manufacture of semiconductor devices on the wafer. Interface trap charge pumping is a well-known transient recombination effect that is activated by cycling or pumping the Si—SiO$_2$ interface of the MOSFET between accumulation and inversion states. Charge-pumping measurements can then be used to extract or determine interface trap density, and the effect of gate leakage can be compensated for by measuring charge-pumping current at a low frequency, for example, and then subtracting it from measurement results at higher frequencies.

Basic charge-pumping techniques involve measuring the substrate output current while applying input voltage pulses of fixed amplitude, rise time, fall time, and frequency to the gate of the transistor, with the source, drain, and body tied to ground, for example. The electrical pulse can be applied with a fixed amplitude, a voltage base sweep, a fixed base, a variable amplitude sweep, and the like. The charge pumping method can evaluate the surface states at the Si—SiO$_2$ interface of MOSFET devices, for example.

The traditional charge pumping technique for characterizing interface traps fails when tunneling current is comparable to or greater than the charge pumping current, as it is difficult to separate the two currents. A priori estimation of the average gate tunneling current (which is a function of the gate voltage waveform) into the bulk or source/drain of the MOSFET during charge pumping leads to inaccuracies due to the exponential dependence of gate tunneling current on the gate voltage.

FIG. 1 shows a typical conventional setup 100, illustrating the use of a pulse generator 102 to apply a square or trapezoidal pulse wave to a gate 104 that overlies a thin gate oxide 108 of a metal oxide semiconductor field effect transistor (MOSFET) 106. The pulse wave may be square or trapezoidal, or a linear combination of both. Moreover, the pulse wave may be triangular, sinusoidal, rectangular, comb-shaped, or have some other configuration. As illustrated, a source 110 and drain 112 are both shorted together and grounded while measuring the current output ($I_{sub}$) at a current measuring device 114. As a positive or negative bias is applied to the gate 104, the surface of the MOSFET accumulates or inverts, respectively, and if there are interface traps located at the gate oxide/bulk substrate interface (viz., Si—SiO$_2$ interface), the traps will tend to go back to either the conduction band or the valence band, depending on the type of traps present. By pulsating the interface traps rapidly, the technique takes advantage of the fact that traps have only a finite response time, therefore only some of the traps will go back to the conduction or valence band. However, some of the traps will remain "trapped" and recombine with the inversion charge or the accumulation charge coming from the bulk.

There is a substantial current measurement difference between devices, when evaluating an enhanced complementary metal oxide semiconductor (CMOS) as opposed to a MOSFET where the gate dielectric is very thin. Utilizing a thin gate dielectric, if there is an increase in the voltage beyond inversion, or if the device is taken to deep accumulation, a significant amount of gate current will result. However, this gate current is small, when compared to a normal MOSFET operating current, which is the source/drain current. The current measured is a very small current, many orders of magnitude lower than the normal device current. In an advanced CMOS device, the magnitude of the tunneling current approaches and often exceeds the magnitude of the charge pumping current for the density of interface traps of interest. These values can range from tens to hundreds of picoamps per square micron.

Thus, there is a need to provide a method for measuring interface traps in thin gate oxide MOSFETs that overcomes the previously mentioned problems.

SUMMARY

A method is provided for determining charge pumping current to determine the number of interface traps present in a MOSFET.

In accordance with one aspect, the method comprises plotting charge pumping current versus frequency. The method further comprises determining the number of interface traps participating in the charge pumping current based upon the slope of the plot. In addition, the tunneling current can be determined based upon the y-intercept of the plot for a given duty cycle. The method takes advantage of certain realizations: That charge pumping current only occurs at $V_{high}$ to $V_{low}$ or $V_{low}$ to $V_{high}$ transitions; and that, for example, gate tunneling current to the source/drain or substrate depends, to the first order, only on the duty cycle and not the frequency of the gate pulses. The method thus provides a way to separate charge pumping current from tunneling current, when tunneling current for the MOSFET is greater than or equal to the charge pumping current.

Additionally, according to another aspect, the method provides a way to determine the errors in those calculations and plots as well as to validate those measurements.

DETAILED DESCRIPTION OF EXAMPLE EMBODIMENTS

Example embodiments of the principles of the invention are described in the context of methods for measuring interface traps in thin gate oxide MOSFET devices. The described implementations are illustrative only and are not intended to limit the invention, or its application or uses.

As semiconductor devices get smaller, hot carrier induced degradation of such devices may occur. In order to make the MOSFET devices or ultra-large-scale integration (ULSI) components more reliable, it is important to understand and quantify this degradation condition. An example measurement technique that can evaluate the substrate surface conditions at the Si—SiO$_2$ interface is the charge pumping method described above with reference to FIG. 1.

Figure 1:
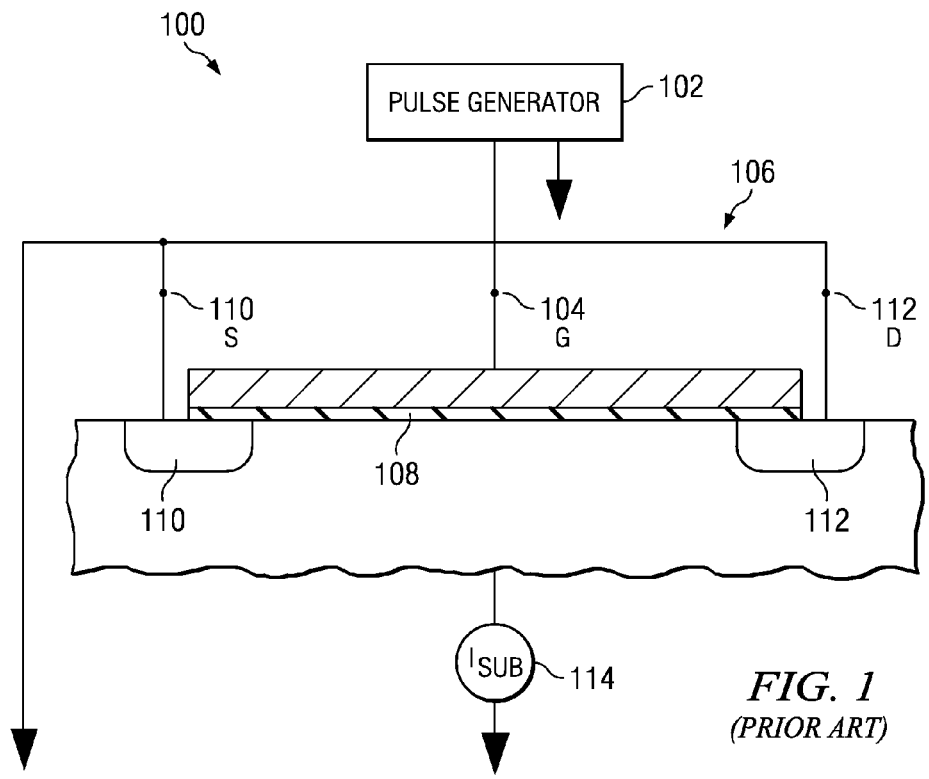
FIG. 1 is a block diagram of a conventional setup used for known charge pumping methods to measure interface traps.
Figure 2:
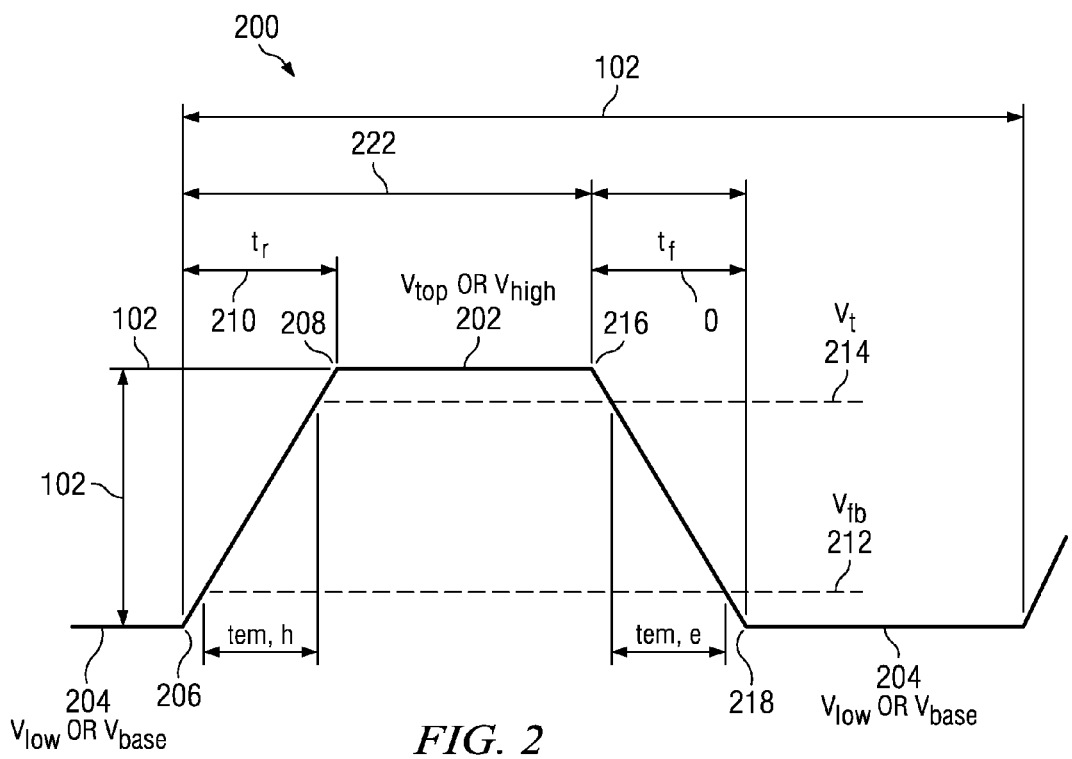
FIG. 2 shows a trapezoidal waveform pulse of a type that may be utilized for charge pumping in example methods according to principles of the invention.

FIG. 2 shows a trapezoidal wave usable for charge pumping with the general setup of FIG. 1 to implement an interface trap measurement method according to the invention. The interface traps between the Si and SiO$_2$ layers that recombine with inversion or accumulation charges will constitute a net DC current. In other words, every time that the gate is pulsed from high voltage 202 (V$_{top}$ or V$_{high}$) to low voltage 204 (V$_{low}$ or V$_{base}$), an ultra-short pulse of current will occur that can be measured. For example, by pulsing the gate at 100 kHz, or 100,000 times per second, a current is integrated to obtain a finite measured current. This basic technique is used widely throughout the industry and academia, for example, to understand interface traps and MOSFET characteristics.

FIG. 2 illustrates the voltage versus time shape of a complete waveform cycle 210 of the trapezoidal wave 200. The waveform cycle 201 begins at a leading edge start point 206 at a lowest voltage 204 (V$_{low}$ or V$_{base}$), then rises with a linear slope in a straight line, up and to the right, from the leading edge start point 206 to a leading edge end point 208 where it levels out at a constant highest voltage 202 (V$_{top}$ or V$_{high}$). The pulse rise time (t$_r$) 210 may be taken as the entire leading edge time it takes to go from the lowest voltage level 204 to the highest voltage level 202. However, the pulse rise time is often measured from a point 212 at 10% above the lowest voltage level 204 to a point 214 at 90% of the highest voltage level 202 (measured rise time shown be "tem, h" in FIG. 2). The waveform continues along a horizontal path at the highest voltage level 202 until it reaches a trailing edge start point 216, then falls with a linear slope in a straight line, down and to the right, from the trailing edge start point 216 to a leading edge end point 218 where it levels out at the lowest voltage level 204 (V$_{low}$ or V$_{base}$) for the remainder of the cycle (viz., until the leading edge start point 206 of a next pulse).

The fall time (t$_f$) 220 may be taken as the entire trailing edge time it takes to go from the highest voltage level 202 to the lowest voltage level 204. However, the pulse fall time is often measured from the point 214 at 90% of the highest voltage level 202 to point 212 at 10% above the lowest voltage level 204 (measured fall time shown by "tem, e" in FIG. 2). The pulse width is the amount of time a pulse remains at a specific (normally "true") logic state. This can either be measured as the time from 50% of amplitude 203 (V$_{high}$–V$_{low}$) at the leading edge to 50% of amplitude 203 at the trailing edge, or as the time 222 (see FIG. 2) from the leading edge start point 206 to the trailing edge start point 216. The wave period 201 is the time it takes to complete one cycle of the waveform (viz., between leading edge start points 206 of successive pulses) and is also the inverse of the wave frequency.

Figure 3A:
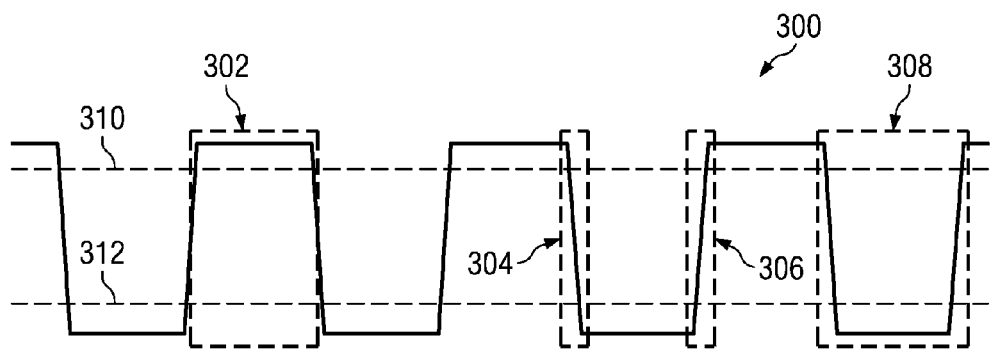
FIGS. 3A and 3B illustrate trapezoidal charge pumping waveforms of different frequencies, helpful in understanding principles of the invention.
Figure 3B:
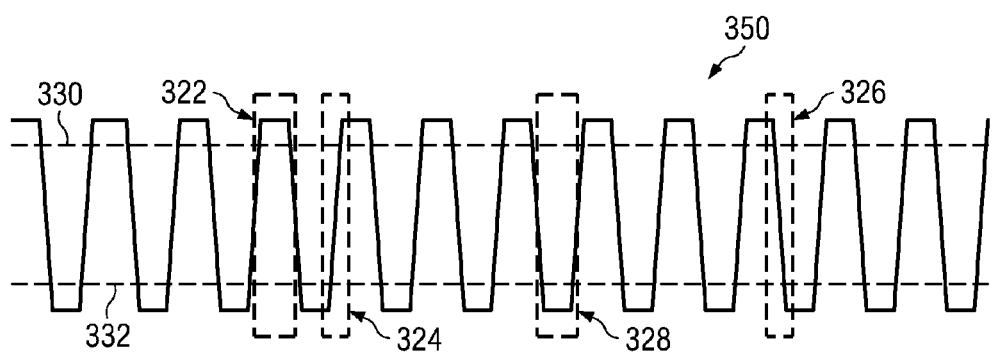

FIGS. 3A and 3B illustrate trapezoidal charge pumping signals 300, 350 of different frequencies. In FIG. 3A, a first region 302 is a flat region wherein the voltage remains at a constant high value (V$_{high}$). In region 302, tunneling current occurs from the gate into the source/drain. A second region 304 is a trailing edge region wherein the voltage goes from high to low (V$_{high}$ to V$_{low}$). The second region 304 is dominated by the charge pumping current from the electron traps. A third region 306 is a leading edge region wherein the voltage goes from low to high (V$_{low}$ to V$_{high}$). The region 306 is dominated by a charge pumping current created from hole traps. A fourth region 308 is a flat region wherein the voltage remains at a constant low value (V$_{low}$). The region 308 is dominated by the gate tunneling current into the substrate. It is apparent from the relative sizes of the regions 302, 304, 306 and 308 that, if the traditional charge pumping technique used, the tunneling current will totally obscure the charge pumping current for the lower frequency waveform of FIG. 3A.

Thus, one aspect of the invention is to provide a method whereby the gate tunneling current can be readily subtracted from the measured charge pumping current, to provide the "real" charge pumping current (i.e., $I_{cp\text{-}real} = I_{cp\text{-}measured} - I_{tunnel}$). The tunneling current has an exponential dependence on the gate-to-source voltage. Therefore, a small error in the estimation of the gate voltage will cause a large error in the tunneling current. What ends up happening is that two large numbers are subtracted in order to wind up with a small number which typically results in a large error (e.g., 100-200%). Ultimately this requires a prior knowledge of the device operation, which is normally not known to a great extent. However, this problem is solved in accordance with the invention by looking at the two currents that make up the total measured current—the tunneling current and the charge pumping current—and understanding what controls or influences each of the two current contributions.

The charge pumping current, as illustrated in FIG. 3A, only occurs at the edge transitions of the pulse (rise and fall regions 304, 306); whereas the tunneling current occurs when the pulse is not in transition (flat regions 302, 308). Looking at the pulse from a signal standpoint, the tunneling current is controlled by the duty cycle of the pulse (i.e., how long the pulse is high in a given time period), while the charge pumping current is determined or influenced by the frequency of the pulse (i.e., number of times the pulse transitions in the given time period).

FIG. 3B illustrates a trapezoidal charge pumping signal 350 similar to the signal 300 shown in FIG. 3A, but with a greater frequency. As can be seen in FIG. 3B, the regions 324, 326 which are dominated by the charge pumping current occur more often per given time period in the higher frequency signal 350, than do the corresponding regions 304, 306 for the same time period in the lower frequency signal 300. Thus, the charge pumping current represents a larger percentage of the total current obtained in the higher frequency signal 350. On the other hand, the tunneling current regions 322, 328 of signal 350 (FIG. 3B) are much smaller than the corresponding tunneling current regions 302, 308 of signal 300 (FIG. 3A). The invention utilizes the realization that the charge pumping current increases as the frequency of the charge pumping signal increases.

Thus, there are two different mechanisms to vary the charge pumping current and to vary the tunneling current, and the two mechanisms are uncoupled from each other. As one mechanism is varied, the other does not vary to the first order.

Figure 4:
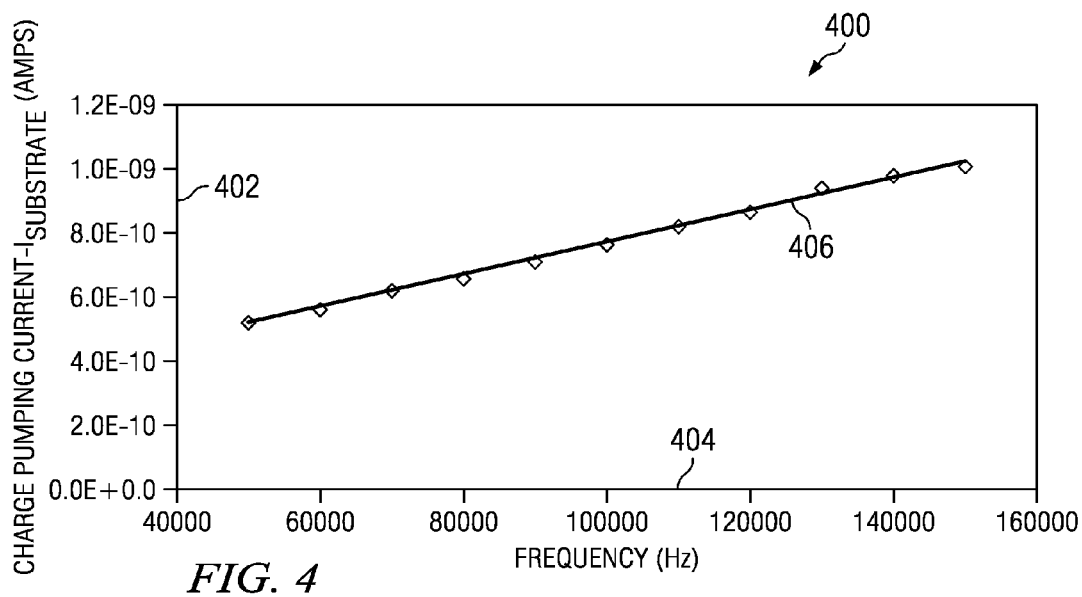
FIGS. 4-9 are graphical representations helpful in understanding principles of the invention.

FIG. 4 is a graph 400 of substrate current ($I_{sub}$) in Amps on a vertical y-axis 402 plotted against frequency of the applied signal in cycles/sec (Hz) on a horizontal x-axis 404 for an example MOSFET with pulse rise time $t_r$=pulse fall time $t_f$=100 nanoseconds (ns); $V_{top}$=0.6 volts; $V_{base}$=−0.9 volts; and W/L=10/5. The slope of the resulting linear curve 406 provides the total interface trapped charge (in this example, 5.08E−15 Coulombs). The y-axis intercept provides the average tunneling current from the gate to the substrate (for example, 2.56E−10 amps). The equations for the curve 406 are given below:

$$y=5.08E-15x+2.56E-10; \text{ and} \quad (1)$$

$$R^2=9.98E-01. \quad (2)$$

The parameter $R^2$ (called the correlation coefficient) is a measure of how closely the variables are correlated together. The closer $R^2$ approximates a value of 1, the "better the fit." The $R^2$ value is a property of the data set and not of the line that is drawn, for example by the least squares criterion. In this case, the $R^2$ value is approximately 1 and there is a very good fit to the data. Consequently, for the given example, FIG. 4 shows that the charge pumping current is a function of the frequency of the pulse applied to the device.

The density of the interface traps ($D_{it}$≈Nit/ΔE) was estimated, using $$\Delta E=-2kT Ln[(\sigma_p \sigma_n t_r t_f)^{1/2} V_{th} n_i (V_t V_{fb}) V_a]; \text{ and} \quad (3)$$

$$(V_t - V_{fb})/V_a \approx 1; \quad (4)$$

wherein k=Boltzmann's constant (Joules/Kelvin); T=absolute temperature (Kelvin); $\sigma_p$=hole capture cross section (cm$^2$); $\sigma_n$=electron capture cross section (cm$^2$); $(\sigma_p \sigma_n)^{1/2}$≈10$^{-15}$ cm$^2$; $t_r$=$t_f$=100 ns=10$^{-7}$ sec.; $V_{th}$=10$^7$ cm/sec. (thermal velocity of carriers in the semiconductor); $n_i$=1.45×10$^{10}$ cm$^{-3}$ (intrinsic carrier concentration at measurement temperature); $V_t$=threshold voltage; $V_{fb}$=flat-band voltage; and $V_a$=amplitude ($V_{high}$−$V_{low}$) of the gate pulse. For ΔE≈0.58 eV (Electron Volts) and $N_{it}$=6.35E+10 cm$^{-2}$ (number of interface traps), Dit≈Nit/ΔE=1.1 E+11 eV$^{-1}$ cm$^{-2}$.

Figure 5:
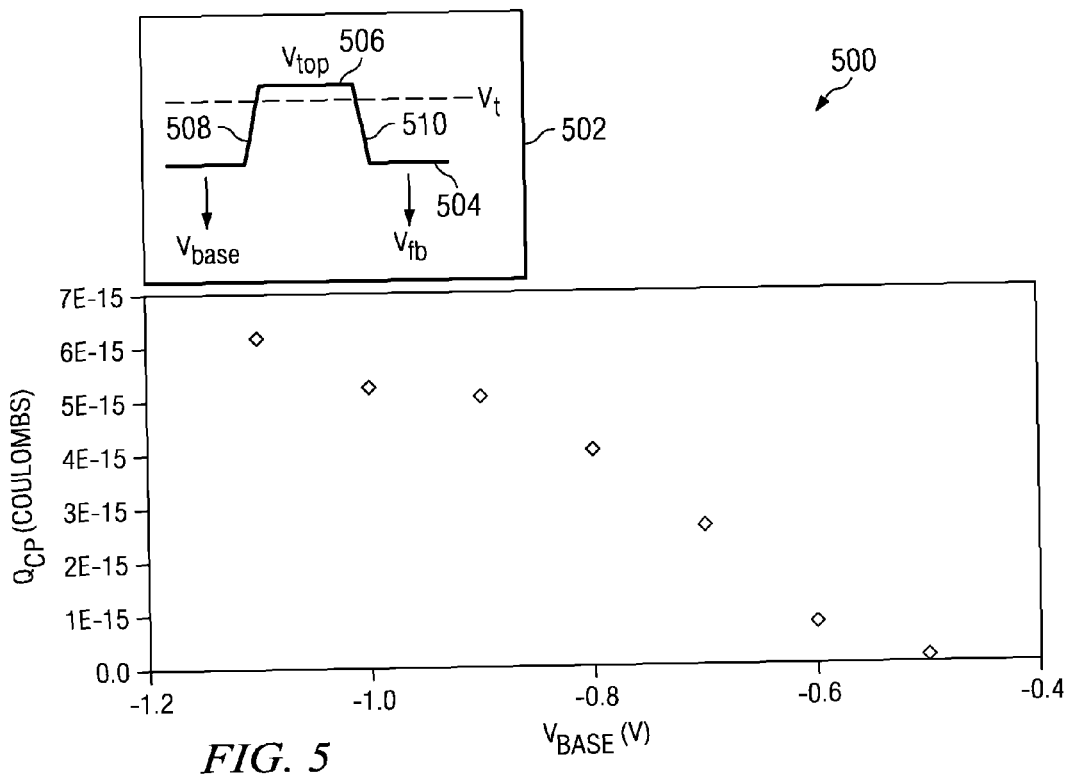

FIG. 5 illustrates results of an experiment that was performed in order to further validate the invention, in a graphical representation 500 of charge $Q_{CP}$ in Coulombs (vertical y-axis) plotted against voltage $V_{base}$ in Volts (horizontal x-axis). One of the characteristics of charge pumping current is that, if the amplitude of the pulse is varied, the charge pumping pulse will disappear or go to zero. The amplitude of the pulse was varied as illustrated in box 502 by adjusting $V_{base}$ 504, while keeping $V_{top}$ 506 constant at 0.6 V (always greater than the threshold voltage $V_t$). The rise time $t_r$ of the leading edge 508 and the fall time $t_f$ of the trailing edge 510 were both=100 ns. The charge pumping current started out relatively flat until the $V_{base}$ reached about −1.2 V, and then the curve progressed downward, until it disappeared when $V_{base}$ reached about −0.5 V. This is typical behavior of what would be seen in a traditional charge pumping technique, when plotting this type of curve. Therefore, what is being measured here, utilizing this aspect of the claimed invention, is charge pumping current, and not, for example, an artifact of tunneling current. If this were measuring tunneling current, the tunneling current would not vary at all, or only slightly over a given range.

Figure 6:
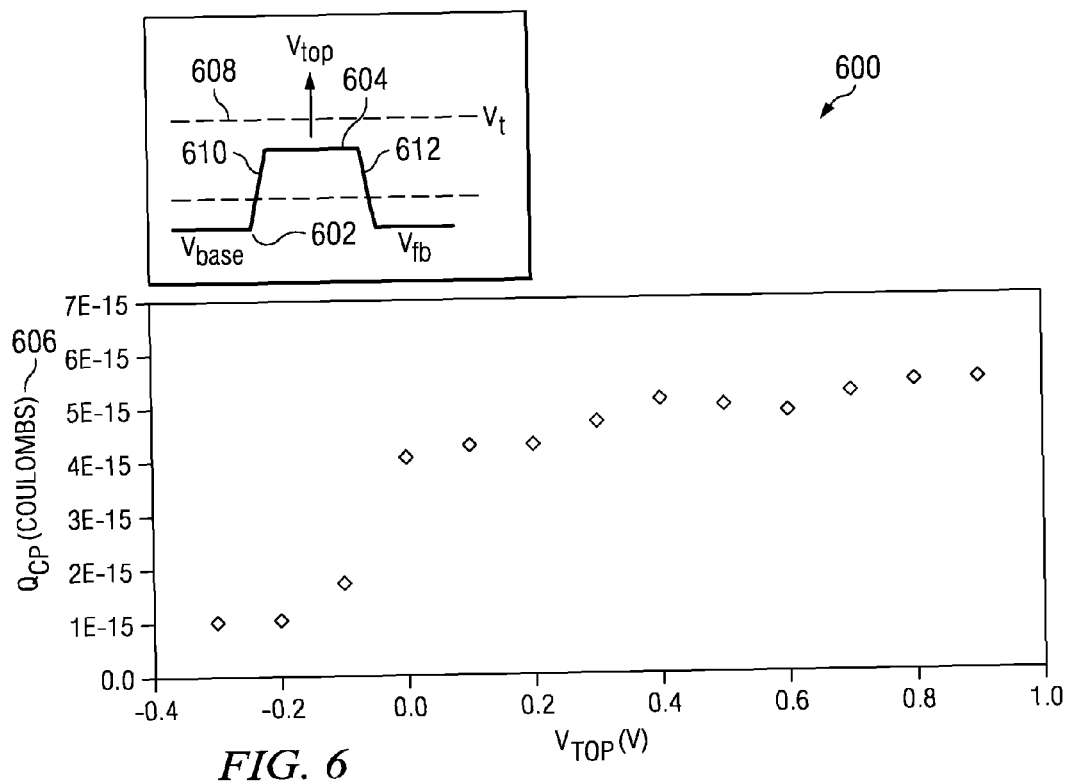

Another experimental result is illustrated, for example, in FIG. 6 which gives a graphical representation 600 of charge $Q_{CP}$ in Coulombs (vertical y-axis) plotted against voltage $V_{top}$ in Volts (horizontal x-axis). In this experiment, the top voltage ($V_{top}$) 604 was varied with the base voltage ($V_{base}$) 602 kept constant. In this experiment, it was expected that the charge $Q_{CP}$ 606 would saturate when the voltage $V_{top}$ 604 became greater than a threshold voltage Vt 608. In this test, the voltage, $V_{base}$ 602 was kept at approximately −0.95 V, the rise time $t_r$ 610 and fall time $t_f$ 612 were both set to 100 ns, and the W/L ratio was 10/5. Once the amplitude of the pulse $V_{top}$ 604 exceeds the threshold voltage ($V_t$) 608 it was anticipated that the charge pumping current would approximately flatten out, and referring to graphed results given in FIG. 6, this was clearly the case.

Figure 7:
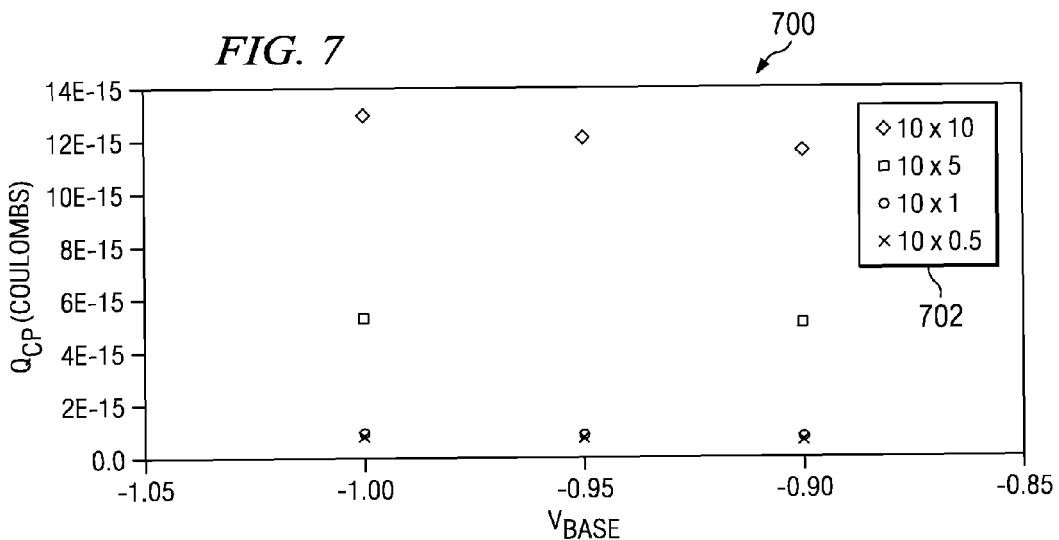

FIG. 7 represents graphically the number of interface traps ($N_{it}$) versus a base voltage ($V_{base}$) measured for various devices with different dimensions, as shown by the inset 702. The devices under test (DUT) ranged in size from 1 μm to 10 μm. As illustrated in this graph, the number of interface traps is fairly independent of the base voltage. The rise time and the fall time were both set at 100 ns, and the voltage at the top amplitude ($V_{top}$) was set at a constant 0.6 V.

Figure 8:
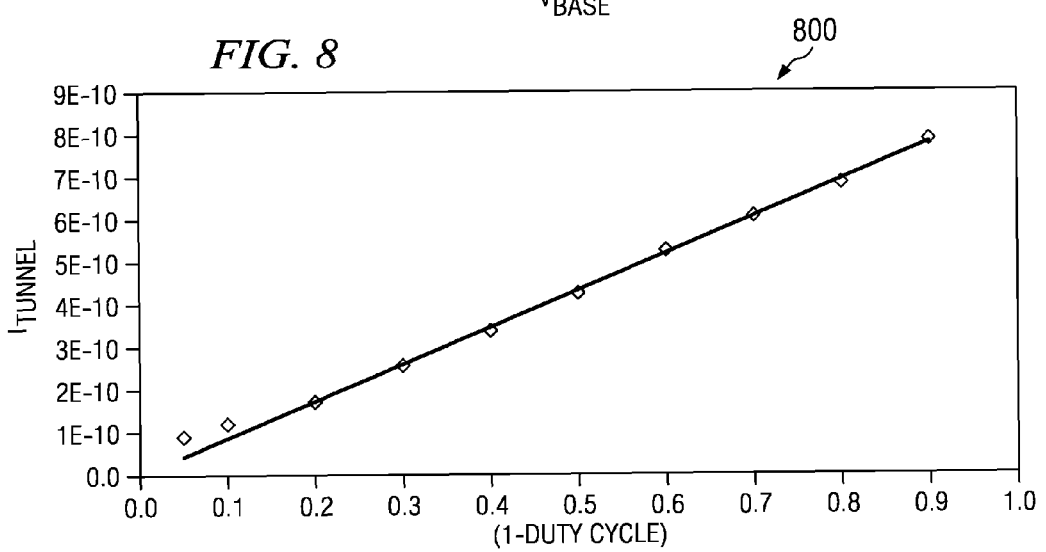

FIG. 8 shows experimental results of tunneling current ($I_{tunnel}$) 802 plotted on the vertical y-axis against duty cycle 804 plotted on the horizontal x-axis. The tunneling current 802 flowing into the substrate from the gate, for a given duty cycle, is estimated from the y-intercept of a line fitted to the tunneling current versus duty cycle plot at that duty cycle. It can be seen from the $R^2$ value of approximately one, that a good linear fit exists which is consistent with the current theory relating to charge pumping. The estimate of tunneling current for this graph is approximately the slope of the line on the left which, for the given example, is 862 pA:

$$y=-10x+8.62E; \text{ and} \quad (5)$$

$$R^2=9.93E-01; \quad (6)$$

wherein pulse rise time $t_r$=pulse fall time $t_f$=100 ns; $V_{top}$=0.6 volts; $V_{base}$=−0.9 volts; and W/L=10/5.

Figure 9:
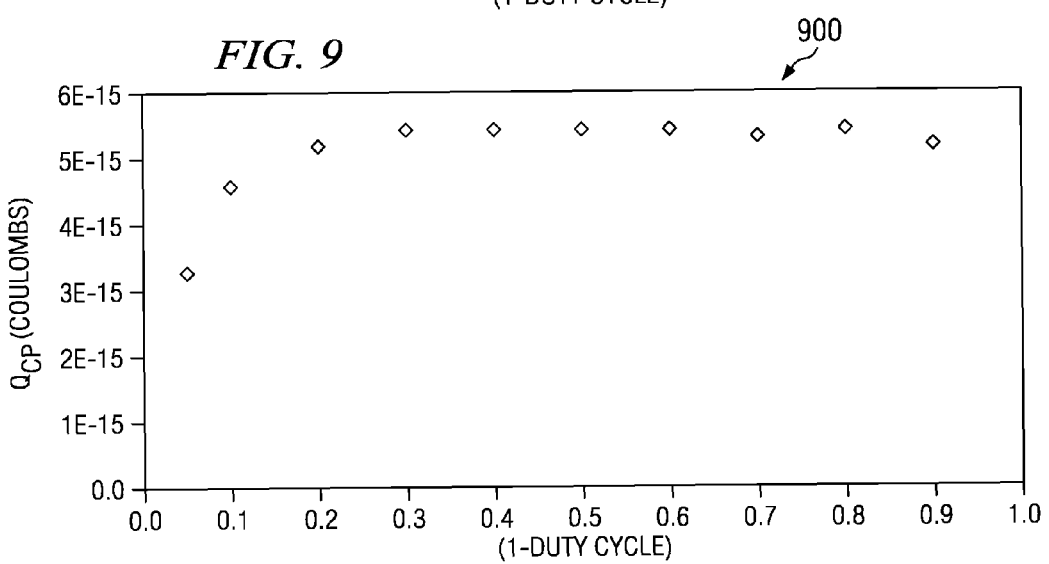

In FIG. 9, experimental results are shown graphically at 900 which illustrate the effect of the duty cycle time on charge pumping current. In this experiment, the width to length ratio=10/5 (W=10 μm), the rise time and fall time were both set equal to 100 ns, $V_{top}$ was set equal to 0.6 V, and $V_{base}$ was adjusted to equal −0.95 volts. At the very low duty cycles (viz., less than 20%), the rise and fall times ($t_r$ and $t_f$) are comparable to the pulse width, and the approximations no longer hold. As the duty cycle increases the graph flattens out, as anticipated. As can be seen, the $Q_{CP}$ remains substantially independent of the duty cycle, until the duty cycle exceeds 80%.

The charge pumping current total charge equation is calculated as:

$$Q_{CP}=D_{it}(2qkT)Ag Ln[(\sigma_p \sigma_n t_r t_f)^{1/2} V_{th} n_i (V_t - V_{fb})/V_a]; \quad (7)$$

wherein $D_{it}$=density of interface traps; q=electron charge; k=Boltzmann's constant (Joules/Kelvin); T=absolute temperature (Kelvin); Ag=MOSFET gate area; $\sigma_p$=hole capture cross section (cm$^2$); $\sigma_n$=electron capture cross section (cm$^2$); $t_r$=pulse rise time; $t_f$=pulse fall time; $V_{th}$=thermal velocity of carriers in the semiconductor; $n_i$=intrinsic carrier concentration at measurement temperature; $V_t$=threshold voltage; $V_{fb}$=flat-band voltage; and $V_a$=amplitude ($V_{high}$−$V_{low}$) of the gate pulse.

The component of the gate tunneling current ($I_{tunnel}$) that enters or goes into the substrate has a linear frequency dependence and can, for example, be a source of error in the $Q_{CP}$ measurement. The following can be used as an approximation of the tunneling current into the substrate:

$$I_{tunnel,\,avg}=(1/T)(1/K_f+1/K_r)\int I(V)dV+\{(1-DC)-(t_r+t_f)/(2T)\}I(V_{low});\quad(8)$$

wherein T=pulse period (one complete cycle); 1/T=f=pulse frequency (Hz); $K_f=t_f/(V_{high}-V_{low})$; $K_r=t_r/(V_{high}-V_{low})$; DC=duty cycle=τT/T; τ=duration of operation (i.e., time when Vpulse exceeds $V_{low}$); I(V)=substrate current $I_{sub}$ with gate voltage V and source/drain grounded (0 V); $\int I(V) dV$=integral of substrate current $I_{sub}$, as function of gate voltage V, with V ranging from V=$V_{high}$ to V=$V_{low}$; $t_r$=pulse rise time; and $t_f$=pulse fall time. The contribution from I($V_{high}$) can be ignored, for example, as it is very small. (In inversion, the bulk of the gate tunneling current goes to the source/drain terminals and not to the substrate).

It can thus be seen from Equation (8) that the tunneling current ($I_{tunnel}$) has two frequency dependent (f=1/T dependent) terms (1/T) $(1/K_f+1/K_r)\int I(V)$ dV and $(t_r+t_f)/(2T)\}I(V_{low})$, and a duty cycle (DC) dependent term $(1-DC)I(V_{low})$. The duty cycle term is the y-intercept of the substrate current ($I_{sub}$) versus frequency (f) plot and one of the frequency dependent tunneling current ($I_{tunnel}$) terms, $I(V_{low})$ $(t_r+t_f)/2$. Therefore, the duty cycle can, for example, be calculated using the y-intercept value and the rise and fall times of the trapezoidal pulse. The other frequency dependent term term, $(1/K_f+1/K_r)\int I(V)$ dV, can be estimated from the duty cycle $I_{sub}$ versus gate voltage sweep. Table 1, below, shows calculation of the percentage error in $Q_{CP}$ utilizing the two frequency dependent tunneling current terms, for example, for a 5×10 um NMOS device employing $t_r=t_f=100$ ns, $V_{high}=0.6V$, $V_{low}=-0.9V$, and an assumed number of interface traps $N_{it}$=5E+10/cm$^2$. The measured duty cycle substrate current $I_{sub}$ versus gate voltage $V_{gate}$ data was used to compute $\int I(V)$ dV. In this manner, both of the errors, mentioned above, can be estimated and thus corrected for.

TABLE 1

| $N_{it}$ | q($N_{it}$)(W)(L) | % Error ($t_r + t_f$)/2 | % Error $\int I(V)$ dV |
|---|---|---|---|
| 5.00E+10 | 4.00E−15 | −3.86 | 0.64 |

Although the invention has been described in the context of certain example implementations, these are intended to be non-limiting, and the invention is intended to encompass all modifications to the described embodiments and additional embodiments that may occur to others skilled in the art, that fall within the scope of the claims.

What is claimed is:

1. A method for measuring interface traps in a MOSFET, comprising:
    measuring gate-to-substrate or gate-to-source/drain current for a pulse waveform applied to a gate of the MOSFET for various frequencies over a predetermined frequency range;
    plotting first points of the measured current versus the various frequencies;
    extracting a first slope and a first intercept with the measured current axis of a linear regression fit of the plotted first points, the first intercept giving a duty cycle dependent term of a tunneling current contribution to the measured current;
    plotting second points of the first intercept versus duty cycle for a fixed rise time, fall time, highest voltage and lowest voltage for the pulse waveform;
    extracting a second slope of a linear regression fit of the plotted second points;
    using the extracted second slope to correct for a first frequency dependent term of the tunneling current contribution;
    using measured current versus gate voltage curves to compute an integral in a second frequency dependent term of the tunneling current contribution; and
    subtracting the first and second frequency dependent terms from the extracted first slope to obtain the charge pumping current contribution to the measured current.

2. The method of claim 1, wherein the tunneling current contribution is estimated according to the following relationship: $I_{tunnel,\,avg}=(1/T)(1/K_f+1/K_r)\int I(V)dV+\{(1-DC)-(t_r+t_f)/(2T)\}I(V_{low})$, wherein the duty cycle dependent term is $(1-DC)I(V_{low})$, the first frequency dependent term is $(t_r+t_f)/(2T)\}I(V_{low})$, and the second frequency dependent term is $(1/T)$ $(1/K_f+1/K_r)\int I(V)$ dV.

3. The method of claim 2, wherein the density of interface traps is estimated using: $D_{it}\approx N_{it}/\Delta E$, wherein $N_{it}$ is the number of interface traps, $\Delta E$ is the range of energy within the semiconductor bandgap that contributes to the charge pumping current.

4. The method of claim 3, wherein $\Delta E$ is determined using:

$$\Delta E = -2kT\,Ln[(\sigma_p\sigma_n t_r t_f)^{1/2}V_{th}n_i(V_t V_{fb})V_a]\text{ and }(V_t-V_{fb})/V_a\approx 1.$$

5. The method of claim 4, wherein a charge pump current total charge is determined from a relationship:

$$Q_{CP}=D_{it}(2qkT)AgLn[(\sigma_p\sigma_n t_r t_f)^{1/2}V_{th}n_i(V_t-V_{fb})/V_a].$$

6. The method of claim 5, wherein the errors in $Q_{CP}$ measurements are estimated using the first and second frequency dependent terms, the rise and fall times, $V_{high}$, $V_{low}$, and $N_{it}$.

7. The method of claim 6, wherein the frequency range is from about 1 KHz to about 10 MHz.

8. The method of claim 7, wherein the charge pumping current is from about zero to about 10 nA.

9. The method of claim 8, wherein the gate thickness of the MOSFET is less than or equal to 20 Angstroms.

10. The method of claim 9, wherein the pulse wave is trapezoidal or square or a combination of both trapezoidal and square.

11. The method of claim 10, wherein an $R^2$ value is calculated to indicate a correlation involving the best fit line and the plotted points.

12. The method of claim 1, wherein the gate thickness of the MOSFET is less than or equal to 20 Angstroms.

13. The method of claim 12, wherein the pulse wave is trapezoidal or square or a combination of both trapezoidal and square.

14. The method of claim 13, wherein the frequency range is from about 1 KHz to about 10 MHz.

* * * * *